(12) United States Patent
Summerfelt et al.

(10) Patent No.: US 6,872,669 B1
(45) Date of Patent: Mar. 29, 2005

(54) PZT (111) TEXTURE THROUGH IR TEXTURE IMPROVEMENT

(75) Inventors: Scott R. Summerfelt, Garland, TX (US); Sanjeev Aggarwal, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/742,190

(22) Filed: Dec. 19, 2003

(51) Int. Cl.[7] .............................................. H01L 21/302
(52) U.S. Cl. ......................................... 438/712; 438/3
(58) Field of Search ................................ 257/295–303; 438/3, 238, 691, 705–712, 720, 961, 966

(56) References Cited

U.S. PATENT DOCUMENTS

| | | |
|---|---|---|
| 6,271,559 B1 | 8/2001 | Iwasaki et al. |
| 6,284,655 B1 | 9/2001 | Marsh |
| 6,316,797 B1 | 11/2001 | Van Buskirk et al. |
| 6,440,210 B1 | 8/2002 | Bruchhaus et al. |
| 6,534,809 B2 | 3/2003 | Moise et al. |
| 6,545,856 B1 | 4/2003 | Norga et al. |
| 6,627,930 B1 | 9/2003 | Fox et al. |
| 2001/0032992 A1 | 10/2001 | Wendt |
| 2002/0014644 A1 | 2/2002 | Van Buskirk et al. |
| 2002/0139772 A1 | 10/2002 | Fenner |
| 2003/0133250 A1 | 7/2003 | Norga et al. |
| 2003/0222299 A1 * | 12/2003 | Miura ........................ 257/306 |
| 2004/0004237 A1 | 1/2004 | Fox |
| 2004/0137158 A1 * | 7/2004 | Kools et al. ................. 427/404 |

* cited by examiner

Primary Examiner—Matthew Smith
Assistant Examiner—Calvin Lee
(74) Attorney, Agent, or Firm—Jacqueline J. Garner; W. James Brady, III; Frederick J. Telecky, Jr.

(57) ABSTRACT

The present invention is directed to a method of forming a ferroelectric capacitor having a (111) PZT texture. The method includes forming a smooth bottom electrode diffusion barrier layer that facilitates a preferential (111) texture in the subsequently formed bottom electrode layer. The (111) bottom electrode layer texture than facilitates a high quality (111) texture in the overlying PZT layer, thereby improving bit-to-bit polarization charge uniformity for various capacitors as the ferroelectric capacitor sizes continue to shrink.

10 Claims, 5 Drawing Sheets

PZT (111) TEXTURE THROUGH IR TEXTURE IMPROVEMENT

FIELD OF THE INVENTION

The present invention relates generally to the field of integrated circuit processing, and more particularly relates to an FeRAM structure and a method of manufacture thereof having a PZT ferroelectric dielectric layer having a generally (111) texture.

BACKGROUND OF THE INVENTION

Several trends exist, today, in the semiconductor device fabrication industry and the electronics industry. Devices are continuously getting smaller and smaller and requiring less and less power. A reason for this is that more personal devices are being fabricated which are very small and portable, thereby relying on a small battery as its supply source. For example, cellular phones, personal computing devices, and personal sound systems are devices in great demand in the consumer market. In addition to being smaller and more portable, personal devices are requiring more computational power and on-chip memory. In light of all these trends, there is a need in the industry to provide a computational device that has a fair amount of memory and logic functions integrated onto the same semiconductor chip. Preferably, this memory will be configured such that if the battery dies, the contents of the memory will be retained. Such a memory device that retains its contents while a signal is not continuously applied to it is called a non-volatile memory. Examples of conventional non-volatile memory include: electrically erasable, programmable read only memory ("EEPROM") and FLASH EEPROM.

Ferroelectric memory devices, such as the FeRAM devices provide non-volatile data storage through the use of a ferroelectric dielectric material that may be polarized in one direction or another in order to store a binary value. The ferroelectric effect allows for the retention of a stable polarization in the absence of an applied electric field due to the alignment of internal dipoles within the Perovskite crystals in the dielectric material. This alignment may be selectively achieved by application of an electric field that exceeds the coercive field of the material. Conversely, reversal of the applied field reverses the internal dipoles.

Data stored in a ferroelectric memory cell is read by applying an electric field to the cell capacitor. If the field is applied in a direction to switch the internal dipoles, more charge will be moved than if the dipoles are not reversed. As a result, sense amplifiers can measure the charge applied to the cell bit lines and provide an indication of a stored logic "1" or "0" at the relevant output. In such case, a read operation is a destructive operation, and the correct data is then restored to the cell during a precharge operation.

In a simple write operation, an electric field is applied to the cell capacitor to polarize it to the desired state. Briefly, the conventional write mechanism for an FeRAM cell includes inverting the dipoles in the ferroelectric capacitor and holding the state with a potential greater than the coercive voltage for a nominal time period.

Certain ferroelectric dielectrics, such as lead zirconate titanate (PZT) may be produced with a variety of crystallographic textures, including <100>, <111>, <001>, and random textures. For example, polycrystalline PZT films having the {100} crystal planes parallel to the substrate surface are said to be <100> textured. Films composed of crystallites that, on average, have no specific crystallographic orientation relative to the substrate surface are said to be randomly oriented.

Textured PZT having a (111) crystallographic orientation is believed to improve FeRAM bit distribution characteristics. However, depending on the type of the FeRAM architecture and processing methodology employed, forming such a textured PZT ferroelectric dielectric layer has proven challenging.

SUMMARY OF THE INVENTION

The following presents a simplified summary in order to provide a basic understanding of one or more aspects of the invention. This summary presents one or more concepts of the invention in a simplified form as a prelude to the more detailed description that is presented later and is not an extensive overview of the invention. In this regard, the summary is not intended to identify key or critical elements of the invention, nor does the summary delineate the scope of the invention.

In accordance with one aspect of the present invention, a method of forming a ferroelectric-device is disclosed. The method facilitates the formation of a quality iridium bottom electrode layer with a (111) texture. The (111) texture iridium layer then facilitates a PZT ferroelectric dielectric layer thereover that also has a (111) texture. Ferroelectric devices having a PZT layer with a (111) texture advantageously facilitate uniform polarization performance across various bits as ferroelectric capacitor sizes continue to shrink.

In accordance with the invention, the iridium bottom electrode layer is formed with a (111) texture by treatment of the underlying bottom electrode diffusion barrier layer. The bottom electrode diffusion barrier layer (e.g., TiAlN) typically has a substantial roughness in its microstructure that tends to facilitate numerous nucleation sites, resulting in an overlying iridium layer that has a random crystallographic structure. The present invention treats the bottom electrode diffusion barrier layer prior to formation of the iridium bottom electrode layer thereover, thereby rendering the top surface thereof smooth and/or amorphous. Consequently, the iridium layer then forms preferentially in a (111) texture over the smooth barrier layer.

In one aspect of the present invention, the bottom electrode diffusion barrier layer is formed and subsequently subjected to ion beam smoothing to smooth a top surface thereof. Such ion beam smoothing substantially reduces the rough microstructure of the bottom electrode diffusion barrier layer. The iridium bottom electrode layer formed thereover then preferentially forms a (111) texture, and a quality (111) texture PZT layer may then be readily formed thereon.

In another aspect of the invention, the bottom electrode diffusion barrier layer is formed and then planarized, for example, via a chemical mechanical polish process to smooth a top surface thereof. The CMP substantially eliminates any microstructure roughness associated with the bottom electrode diffusion barrier layer, thereby facilitating a (111) texture iridium bottom electrode layer thereover.

In yet another aspect of the present invention, the bottom electrode diffusion barrier layer formation process is modified to produce an amorphous barrier layer. The amorphous layer is smooth and thus needs no subsequent treatment prior to the formation of the iridium bottom electrode layer thereover. With the smooth, amorphous top surface of the diffusion barrier layer, the iridium bottom electrode layer is formed with a (111) texture. Subsequently, the PZT layer is formed thereover, also having the advantageous (111) texture.

In still another aspect of the present invention, the TiAlN bottom electrode diffusion barrier layer is replaced with a CrN bottom electrode diffusion barrier layer. The CrN layer acts as an effective barrier, is conductive, and exhibits a smooth microstructure. Accordingly, after deposition thereof, no treatment is necessary, and an iridium bottom electrode layer may be formed thereover having a (111) texture.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

The present invention will now be described with respect to the accompanying drawings in which like numbered elements represent like parts. The figures provided herewith and the accompanying description of the figures is merely provided for illustrative purposes. One of ordinary skill in the art should realize, based on the instant description, other implementations and methods for fabricating the devices and structures illustrated in the figures and in the following description. The present invention is directed to a method of forming an ferroelectric capacitor device having a (111) texture PZT ferroelectric dielectric. The (111) texture PZT is formed by forming a bottom electrode diffusion barrier layer having a smooth top surface associated therewith. The bottom electrode layer subsequently formed thereon then preferentially forms with a (111) texture, thereby facilitating a high quality (111) texture PZT layer thereover.

Figure 1:
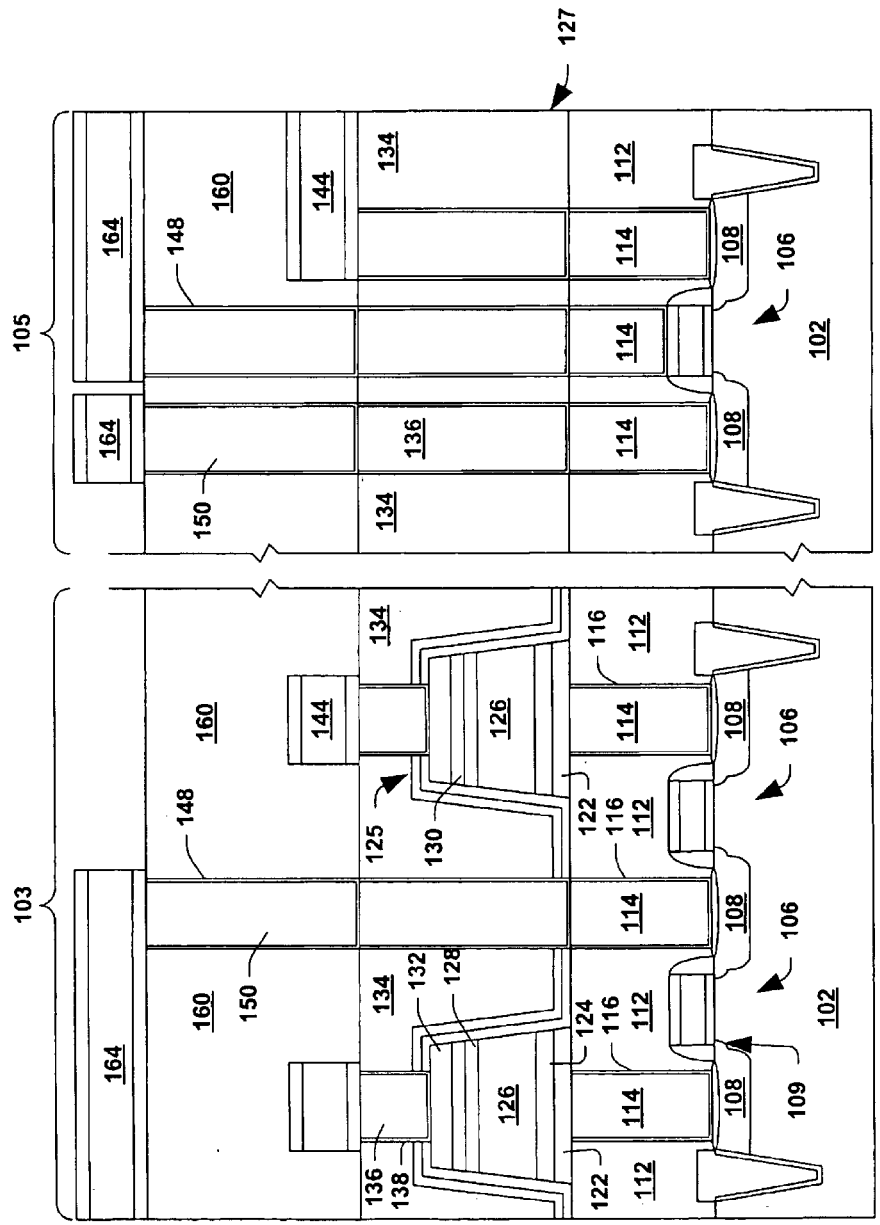
FIG. 1 is a fragmentary cross-sectional view of a partially fabricated device containing FeRAM capacitors and transistors associated therewith fabricated in accordance with one exemplary aspect of the present invention.

Referring initially to FIG. 1, an exemplary, a fragmentary cross section of a semiconductor device 100 is provided in which two devices are illustrated. A first device 103 represents a partially fabricated version of an FeRAM cell in accordance with the present invention, and a second device 105 represents any high-voltage transistor, low-voltage transistor, high-speed logic transistor, I/O transistor, analog transistor, or any other device which may be included in a digital signal processor, microprocessor, microcomputer, microcontroller or any other semiconductor device. Except for the specific cell structure provided in the device 103, the structures utilized therein may be the same as the device structures of the device 105 (except for some possible variations in the transistors due to the different device types that device 105 may be).

Basically, transistor gate structures 106 include a gate dielectric (for example, comprising silicon dioxide or a high-k material), and a gate electrode (for example, comprising polycrystalline silicon doped either p-type or n-type with a silicide formed on top, or a metal such as titanium, tungsten, TiN, tantalum, TaN or other type metal). The gate structures 106 further comprise side wall insulators (for example, comprising an oxide, a nitride, an oxynitride, or a combination or stack thereof). In general, the generic terms oxide, nitride and oxynitride refer to silicon oxide, silicon nitride and silicon oxy-nitride. The term "oxide" may, in general, include doped oxides as well, such as boron and/or phosphorous-doped silicon oxide. Source/drain regions 108 may be formed via, for example, implantation using conventional dopants and processing conditions. Lightly doped drain extensions 109 as well as pocket implants may also be utilized. In addition, the source/drain regions 108 may be silicided (for example, with titanium, cobalt, nickel, tungsten or other conventional silicide material).

A dielectric layer 112 is formed over the entire substrate 102 and is patterned and etched so as to form openings for contacts to the substrate and gate structures 106 to be formed. These openings are filled subsequently with one or more conductive materials, such as a plug 114 (for example, comprising a metal such as tungsten). A liner/barrier layer 116 mayor may not be formed between the conductive plug 114 and dielectric 112. Such a liner/barrier layer 116 is illustrated in FIG. 1 and comprises, for example, Ti, TiN, TaSiN, Ta, TaN, TiSiN, a stack thereof, or any other conventional liner/barrier material. Preferably, the contacts are formed so as to land on the silicided regions of the source/drain regions and gate structures.

The dielectric layer 112 comprises, for example, $SiO_2$ (doped or undoped with preferable dopants such as boron or phosphorous) possibly with a layer of hydrogen or deuterium containing silicon nitride next to the gate. After deposition of the diffusion barrier 116 it is likely that the barrier will be planarized for improved lithography of overlying layers using a process such as chemical mechanical polishing (CMP).

Formation of metal structures that are situated above the contacts is considered to be part of the back end processes. Other than the specific FeRAM process module, the back end process steps may be those standard in the semiconductor industry. The metallization may be, for example, either Al or Cu based. The Al is preferably etched while the Cu is preferably used in a damascene approach. However, etching Cu and Al formed in a damascene process is also possible. According to one example, aluminum metallization will preferably have CVD tungsten plugs or Al plugs, and the Al will preferably be Cu-doped for improved electromigration resistance. Metal diffusion barriers for Al may include, for example, TiN and/or Ti. Copper metallization may have, for example, Cu or W plugs with Ti, TiN, TiSiN, Ta, tantalum nitride, and/or TaSiN diffusion barriers.

A thin dielectric layer (not shown) may be formed between each of the interlevel dielectric (ILD) layers (layers 112, 134 and 160). If formed, this thin dielectric comprises, for example, silicon nitride, silicon carbide, SiCNO or a silicon oxide (for example, a high-density plasma oxide). In addition, interlevel dielectric layers 112, 134, and 160 may comprise, for example, an oxide, FSG, PSG, BPSG, PETEOS, HDP oxide, a silicon nitride, silicon oxynitride, silicon carbide, silicon carbo-oxy-nitride, a low dielectric constant material (for example, SiLK, porous SiLK, teflon, low-K polymer (possibly porous), aerogel, xerogel, BLACK DIAMOND, HSQ, or any other porous glass material), or a combination or stack thereof.

The interconnects and the metal lines preferably comprise the same material. Plugs 136 and 150 and conductors 144 and 164 comprise a metal material (for example, copper, aluminum, titanium, TiN, tungsten, tungsten nitride, or any combination or stack thereof). A barrier/liner may be formed between the plug and the respective interlevel dielectric layer. If formed, the barrier/liner layer (shown as layers 138 and 148 and liners 142, 146, 162 and 166) comprises, for example, Ti, TiN, W, tungsten nitride, Ta, tantalum nitride, any conventional barrier/liner layer, or any combination or stack thereof). The interlayer dielectric and plug material should be compatible with the FeRAM thermal budget. With existing technology (i.e., one that incorporates a W plug and $SiO_2$ ILD), the FeRAM thermal budget should be less than approximately 650° C., however, the present invention is not limited thereto. If the ILD is modified to include a low dielectric constant ("low K") layer, the FeRAM thermal budget may need to be reduced further. The preferred interlayer dielectric 112 is therefore a material that can withstand a thermal budget in excess of 600° C., such as silicon oxide (doped and/or undoped), silicon nitride, and/or silicon oxynitride.

Level 127 is added so as to accommodate the FeRAM cells (FeRAM process module). This FeRAM process module allows the creation of ferroelectric or high dielectric constant capacitors to be easily added with maximum thermal budget for the new process module yet not impact the thermal budget of backend process. In particular, this level allows FeRAM devices with capacitor under bit line configuration compatible with a high-density memory. However, it is possible, if planarity is not a necessity, to form the FeRAM devices while not forming layer 127 in region 105. Hence, the FeRAM portion 103 would be taller than the region 105 by the height of layer 127.

Initially, a further discussion of FIG. 1 will be provided to appreciate the structure of an FeRAM cell and an exemplary integration position of such a cell within a semiconductor fabrication process. It should be understood, however, that although the present invention will be shown and described in conjunction with one exemplary context, the invention is applicable to other fabrication methodologies, structures and materials, and such alternatives are contemplated as falling within the scope of the present invention.

An FeRAM capacitor, as illustrated in FIG. 1 at reference numeral 125, resides above the interlayer dielectric 112, and comprises several layers. The FeRAM capacitor 125 comprises an electrically conductive barrier layer 122 upon which a conductive bottom capacitor electrode 124 resides (hereinafter, the terms conductive and insulative are employed to indicate electrically conductive and electrically insulative, respectively, unless indicated otherwise). The bottom electrode layer 124 may comprise a single conductive layer or a multi-layer stack. A capacitor dielectric layer 126, a ferroelectric material, is formed over the bottom electrode 124, and is covered by, for example, a conductive multi-layer top electrode 128, 130. A top portion of the FeRAM capacitor 125 comprises a hard mask layer 132 that may be employed to facilitate the capacitor stack etch. The capacitor stack is covered by a multi-layer sidewall diffusion barrier.

As briefly described earlier, a textured PZT having a (111) texture is believed to improve the FeRAM bit distribution characteristics. One manner of achieving (111) textured PZT is to form (111) Ir as the bottom electrode layer 124 and form the PZT thereon, wherein the (111) Ir texture serves to preferentially form the (111) PZT texture. Unfortunately, forming a quality (111) texture Ir layer 124 is difficult in the above device 100 because the Ir layer is formed on the bottom electrode diffusion barrier layer 122 (e.g., TiAlN) and the barrier layer topography and/or crystallography tends to denigrate the (111) Ir texture.

Crystalline columnar TiAlN tends to have a very rough surface at the micro level where grains have sharp facets on the film surface. These surface facets in the TiAlN allow the Ir to grow at different textures with respect to the surface. Consequently, the resultant bottom electrode layer 124 (e.g., iridium) is columnar and contains facets. This may lead to a PZT dielectric layer 126 with small grain sizes that results in a high nucleation rate of PZT during crystallization (the high nucleation rate is believed to be due to the large surface of the underlying columnar layer). The resultant facets form fixed angles with respect to the growth direction. The surface roughness makes the formation of a nucleus with the desired crystal structure energetically favorable during crystallization because the nucleation can occur within a recess at the surface between adjacent grains.

The present invention is directed to generating a high quality (111) texture PZT film in a ferroelectric device by improving the (111) texture of the underlying bottom electrode layer. In one aspect of the present invention the (111) texture of the bottom electrode layer is improved by smoothing the underlying bottom electrode diffusion barrier layer. In one example, the bottom electrode diffusion barrier layer is smoothed using ion beam smoothing that amorphizes the surface thereof. In another example, the bottom electrode diffusion barrier layer is planarized (e.g., via CMP) to achieve a smooth, amorphous top surface. In yet another example, an amorphous bottom electrode diffusion barrier layer deposition is conducted, wherein a rough, crystalline columnar surface is avoided. In each of the above examples, the resultant smooth surface allows the overlying bottom electrode layer to nucleate and grow with the energetically preferred (111) texture.

An exemplary method of forming an FeRAM capacitor in accordance with the present invention which is similar in many respects to the capacitor 125 of FIG. 1 will now be discussed in conjunction with FIG. 2, wherein a method 200 of forming an FeRAM capacitor is disclosed. Although the exemplary method 200 and other methods of the invention are illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Further, the methods according to the present invention may be implemented in association with the formation and/or processing of structures illustrated and described herein as well as in association with other structures and devices not illustrated.

Figure 3:
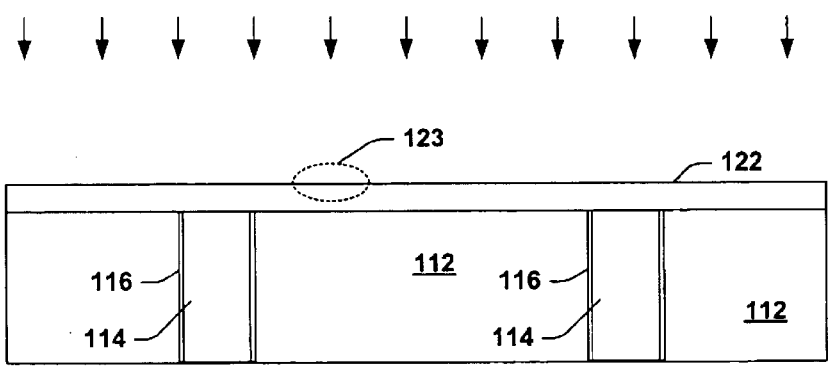
FIG. 3 is a fragmentary cross section diagram illustrating a bottom electrode diffusion barrier layer overlying an interlayer dielectric.
Figure 4:
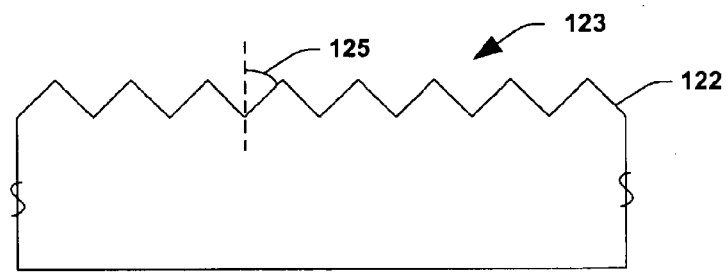
FIG. 4 is an exploded fragmentary cross section of a surface portion of the bottom electrode diffusion barrier layer having a non-smooth upper surface.

According to one aspect of the present invention, once the underlying transistors, interlayer dielectric 112 and the tungsten contacts 114 are formed (front end processing), the FeRAM capacitor formation process begins. According to the present invention, a bottom electrode diffusion barrier layer 122 is formed over the planarized tungsten plug 114 and interlayer dielectric 112 at 204, wherein a top surface thereof is smooth. In accordance with the present invention, a smooth top surface of the bottom electrode diffusion barrier layer relates to an angle associated with the surface microstructure thereof. For example, as illustrated in FIGS. 3 and 4, when a bottom electrode diffusion barrier layer such as TiAlN 122 is formed (e.g., via physical vapor deposition), a top surface 123, at the microstructure level, is quite rough. For example, the surface 123 resembles mountain peaks, wherein an angle 125 formed by the surface microstructure is about 35 degrees or more.

A smooth microstructure, according to the present invention, corresponds to a surface microstructure that is generally less rough than FIG. 4, that is corresponds to an surface microstructure angle 125 substantially less than about 35 degrees. In one preferred example, the microstructure angle is about 10 degrees or less, and even more preferable, about 5 degrees or less. The inventors of the present invention appreciated that the surface microstructure roughness of traditional barrier layers disadvantageously degraded the subsequent bottom electrode layer texture (e.g., away from a (111) texture), thereby degrading the subsequently formed PZT layer.

Figure 5:
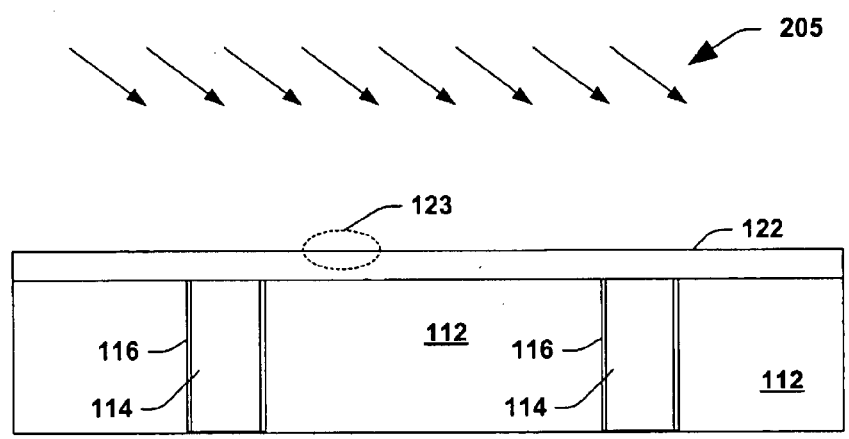
FIG. 5 is a fragmentary cross section diagram illustrating a bottom electrode diffusion barrier layer such as that illustrated in FIG. 3 undergoing ion beam smoothing in accordance with one aspect of the present invention.
Figure 6:
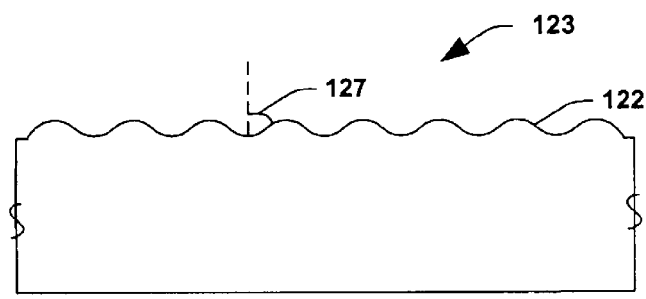
FIG. 6 is an exploded fragmentary cross section of a surface portion of the bottom electrode diffusion barrier layer having a smooth upper surface due to the ion beam smoothing of FIG. 5.

In accordance with one aspect of the present invention, a smooth bottom electrode diffusion barrier layer is formed at 204 of FIG. 2 by depositing a barrier layer in a conventional manner and subsequently smoothing the top surface 123 using ion beam smoothing. For example, a bottom electrode diffusion barrier layer such as TiN, TiAlN or TiAlON is formed by PVD or sputtering, followed by ion smoothing of the resultant top surface. In one example, the ion beam smoothing comprises subjecting the surface 123 to ions, for example, argon, nitrogen or oxygen ions. Tests have found that the impinging ions strike the barrier surface and cause raised portions to be physically "pushed" or displaced into the low regions of the surface microstructure, wherein the resultant microstructure is substantially smooth, for example, as illustrated in FIG. 5. The impending ions 205, in one example, are directed toward the surface 123 at an angle relative to the normal to facilitate the smoothing of the surface, however, any implant angle may be employed in accordance with the invention. An exemplary barrier surface 123 after ion beam smoothing is illustrated in FIG. 6.

Note that the smoothed surface 123 in this example, is not fully planar, but rather has undulations thereon that are substantially reduced with respect to angle (as opposed to an rms roughness value). For example, in FIG. 6, the angle 127 of the smoothed surface has an angle of about 10 degrees or less, and more preferably has an angle of about 5 degrees or less.

Figure 2:
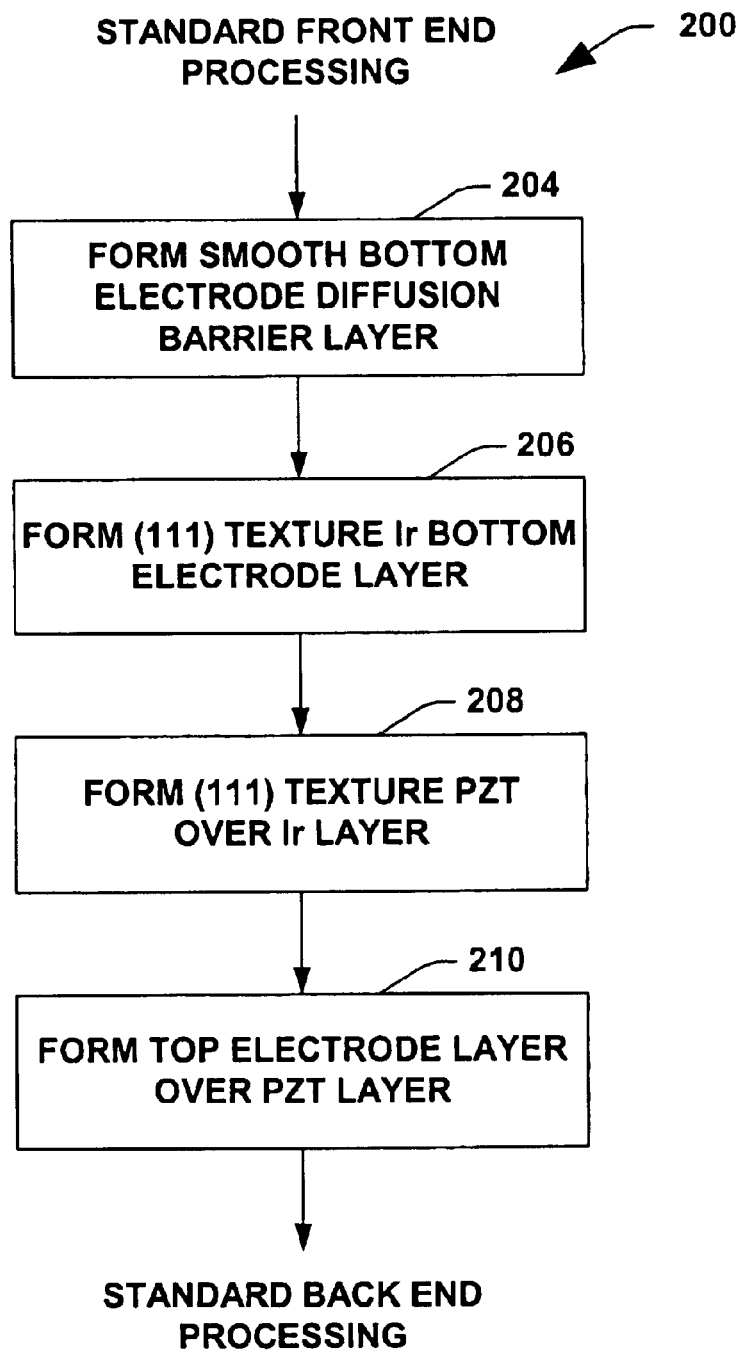
FIG. 2 is a flow chart diagram illustrating a method of forming an FeRAM capacitor in accordance with another exemplary aspect of the present invention.

In another exemplary aspect of the present invention, the smooth bottom electrode diffusion barrier layer 122 is formed at 204 of FIG. 2 by depositing the barrier layer in a conventional manner as described supra, and then performing a planarization process. In one example, the deposited barrier layer 122 is planarized via a chemical mechanical polish (CMP) process, for example, as illustrated in FIGS. 7A and 7B, respectively.

Figure 7A:
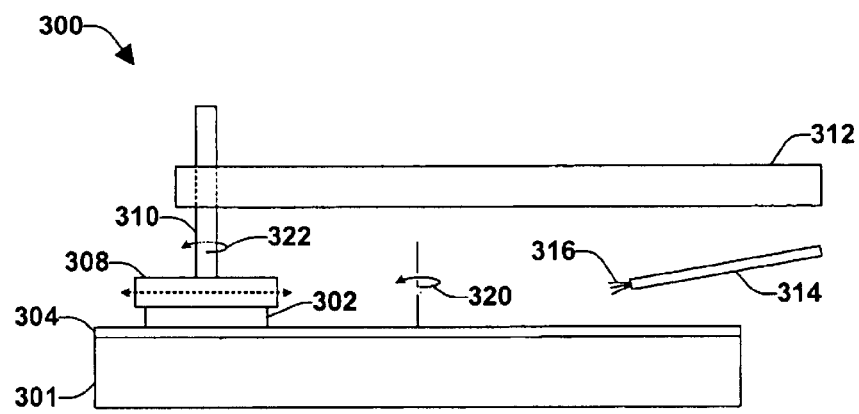
FIGS. 7A and 7B are side elevation and plan views, respectively, of an exemplary CMP apparatus for employment in planarizing a bottom electrode diffusion barrier layer in accordance with another aspect of the invention.
Figure 7B:
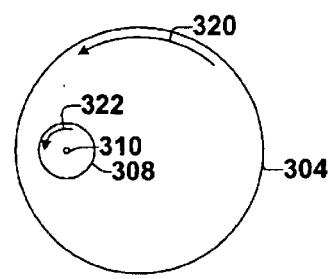

In FIGS. 7A and 7B, a CMP apparatus or system 300 is illustrated. The system 300 comprises a rotatable platen 301 and a polishing pad 304 mounted on the platen 301, which may be rotatably driven by a control motor (not shown) to rotate at a controlled speed, for example, about 10 to about 100 RPM. The pad 304 advantageously operates in conjunction with a slurry to planarize the wafer 302. The wafer 302, in the above example, is mounted on the bottom of a rotatable carrier assembly 308 so that a major surface of the wafer 302 to be polished is positionable to contact the underlying polishing pad 304. The wafer 302 and the carrier assembly.308 are attached to a vertical spindle 310 that is rotatably mounted in a lateral arm 312.

The spindle 310 operates to rotate the carrier assembly 308 at a controlled speed, such as about 10 to about 75 RPM, in the same direction as that of the platen 201, and further radially positions the carrier assembly 308 on the platen 301. The arm 312 also vertically positions carrier assembly 308 so as to position the wafer 302 in contact with the polishing pad 304, and maintains an appropriate polishing contact pressure. A tube 314 is located opposite the carrier assembly 308 and above the polishing pad 304 to dispense and evenly saturate the pad 304 with an appropriate cleaning agent 316, such as a slurry. As further illustrated in FIG. 7B, the polishing pad 304, in the present example, rotates in the direction of arrow 320, while the carrier assembly 308 rotates in the direction of arrow 322, similar to the direction of arrow 320, but at a different speed than the polishing pad 304, while a downward force is applied to the carrier assembly 308 via the spindle 310 in a direction perpendicular to carrier assembly 308.

Tests with a CMP process has shown exceptional results in obtaining a smooth film surface, wherein virtually all the surface roughness is removed. The CMP process may be followed by a rinse process to remove any particulates and/or slurry remaining on the substrate, as may be desired.

In another option, a smoothing of the bottom electrode diffusion barrier layer may be obtained by depositing the layer using a chemical vapor deposition process (CVD) instead of PVD. It is believed that in some cases, the resultant CVD barrier film has a top surface roughness that may be sufficient smooth to obtain a preferential (111) texture in the subsequently formed iridium electrode layer.

In accordance with yet another exemplary aspect of the present invention, the smooth bottom electrode diffusion barrier layer may be formed at 204 of FIG. 2 by formation of the layer as an amorphous film. Since the surface roughness of the barrier layer is thought to be primarily due to the crystalline nature of the film, by forming the layer as an amorphous film, the surface roughness is greatly reduced, thereby resulting in smooth film that facilitates a preferential (111) texture in the subsequently formed bottom electrode layer thereover. The formation of an amorphous film, according to one exemplary aspect of the invention, is accomplished via a substantially reduced deposition temperature. In contrast to conventional film deposition temperatures of about 400 C, for example, the present invention employs a reduced deposition temperature of less than about 200 C, and more preferably about room temperature, or about 20 C.

In conjunction with the reduced deposition temperature, the amorphous film deposition process further contemplates substantially altering the nitrogen to argon feed gas ratio. In contrast to conventional deposition processes, that use a nitrogen to argon ratio of about 1X-2X N:Ar, the amorphous deposition process of the present invention employs a ratio of 2X-3X Ar:N, wherein the nitrogen percentage is greatly reduced, wherein the TiAlN film is not as heavily nitrided.

In addition, in one example, a small amount of oxygen is added in order to reduce the tendency of the film to crystallize during deposition. For example, TiN and TiAl both easily form a crystalline phase; by adding a small amount of oxygen to form TiAlON, the film tends to remain amorphous and smooth. In accordance with one example, the oxygen to nitrogen ratio is quite small, for example, about 20–50:1 (that is, $1/20^{th}$ to $1/50^{th}$ the amount of nitrogen). The resultant TiAlON film then has a percentage of oxygen in the film of about 5–10% or less. Although the resultant amorphous TiAlON is more resistive than a crystalline film (which would typically discourage one from considering such a film), the high quality (111) PZT texture obtained due to the smoothness of the barrier provides for improved polarization charge per unit area.

In accordance with yet another aspect of the present invention, the smooth bottom electrode diffusion barrier layer can be formed at 204 of FIG. 2 by abandoning the TiAlN based barrier and replacing that film with a chromium nitride (CrN) film. Iridium (the bottom electrode layer) has been found to form preferentially in a (111) texture on an AlN film. Although AlN is an insulating film, it has the same wurtzite type structure as CrN, and therefore CrN, a conductive film that also has diffusion barrier properties similar to TiAlN type films, may be employed. Further such a film is believed to have sufficient smoothness to facilitate the high quality (111) iridium texture that will facilitate the desired (111) PZT texture discussed above.

Returning to FIG. 2, after the smooth bottom electrode diffusion barrier layer is formed at 204, an iridium bottom electrode layer 124 is formed thereover at 206. The iridium layer may be formed, for example, via sputtering, reactive sputtering, or chemical vapor deposition. Due to the smoothness of the bottom electrode diffusion barrier layer 122, the iridium bottom electrode film advantageously forms preferentially with a (111) texture. As will be appreciated, the iridium bottom electrode layer may be substantially pure iridium, or may comprise a multi-layer stack of iridium followed by iridium oxide (e.g., reactive sputtering). In the case of substantially pure iridium, a thin iridium oxide layer in some cases may form thereover during the PZT film formation.

Subsequently, a PZT film 126 is formed over the bottom electrode layer at 208. Due to the (111) texture of the underlying iridium bottom electrode layer 124, the PZT film forms advantageously with the desired (111) texture. In one example, the PZT film is formed via metal organic chemical vapor deposition (MOCVD), however, other deposition techniques may be employed and are contemplated as falling within the scope of the present invention. As discussed above, the (111) PZT texture advantageously improves the polarization charge, thereby facilitating reduced scaling of the ferroelectric capacitor sizes without a substantial degradation in bit-to-bit polarization charge uniformity.

Although the above example has the PZT film 126 formed directly over the iridium layer 124, it should be understood that a conductive oxide layer may be formed thereover prior to formation of the PZT, and such variation is contemplated by the present invention. For example, any conductive perovskite materials may be employed. Exemplary conductive oxides include, but are not limited to, strontium ruthanate (SrRuO3), and lanthanum nickel oxide. When such conductive oxides are formed over the (111) iridium bottom electrode layer 124, the oxides also form the (111) texture that is then transferred to the PZT film as it subsequently forms thereover.

The method 200 of FIG. 2 continues at 210, wherein a top electrode layer such as an iridium oxide 128 and iridium 130 multi-layer stack, is formed over the PZT layer 126. The layers are then patterned to form separate ferroelectric capacitor stacks using, for example, a hard mask layer 132, followed by formation of sidewall diffusion barriers, as may be desired. A dielectric layer 134 is formed over the capacitor stacks, with conductive interconnects 136 formed down thereto, followed by standard back end metallization processing to complete the various desired interconnections.

Although the invention has been shown and described with respect to a certain aspect or various aspects, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several aspects of the invention, such feature may be combined with one or more other features of the other aspects as may be desired and advantageous for any given or particular application. Furthermore, to the extent that the term "includes" is used in either the detailed description or the claims, such term is intended to be inclusive in a manner similar to the term "comprising."

What is claimed is:

1. A method of forming a ferroelectric device, comprising:
   forming a bottom electrode diffusion barrier layer over a substrate, the bottom electrode diffusion barrier layer having a smooth top surface associated therewith, wherein forming the bottom electrode diffusion barrier layer with the smooth top surface comprises depositing the layer by either physical vapor deposition or sputtering followed by ion beam smoothing thereof with an ion beam;
   forming a bottom electrode layer over the bottom electrode diffusion barrier layer, wherein the top surface of the bottom electrode diffusion layer is sufficiently smooth to facilitate formation of the bottom electrode layer thereover having a (111) texture associated therewith;
   forming a PZT ferroelectric dielectric layer over the bottom electrode layer, wherein the PZT ferroelectric dielectric layer comprises a (111) texture associated therewith; and
   forming a top electrode layer over the PZT ferroelectric dielectric layer.

2. The method of claim 1, wherein forming the bottom electrode diffusion barrier layer comprises:
   forming a TiAlN or a TiAlON layer; and
   ion beam smoothing a top portion of the TiAlN or TiAlON layer to form the smooth top surface.

3. The method of claim 2, wherein the TiAlN or TiAlON layer is ion beam smoothed with an ion beam comprising argon ions.

4. The method of claim 3, wherein the ion beam further comprises nitrogen ions.

5. The method of claim 4, wherein the ion beam further comprises oxygen ions.

6. The method of claim 2, wherein the TiAlN or TiAlON layer has a surface roughness prior to ion beam smoothing comprising an average trough to peak angle of about 35 degrees or more, and a surface roughness after ion beam smoothing comprising an average trough to peak angle of about 10 degrees or less.

7. The method of claim 1, wherein the bottom electrode layer comprises iridium.

8. The method of claim 1, further comprising forming a conductive oxide layer over the bottom electrode layer having the (111) texture prior to forming the PZT layer, wherein the conductive oxide layer also forms with a (111) texture.

9. The method of claim 8, wherein the conductive oxide layer comprises a perovskite material.

10. A method of forming a ferroelectric device, comprising:

forming a TiAlN, TiAlON or a CrN bottom electrode diffusion barrier layer over a substrate, the bottom electrode diffusion barrier layer having a smooth top surface associated therewith, wherein forming the TiAlN or the TiAlON bottom electrode diffusion barrier layer with the smooth top surface comprises depositing the layer by either physical vapor deposition or sputtering followed by ion beam smoothing thereof with an ion beam;

forming an iridiu bottom electrode layer over the smooth top surface of the bottom electrode diffusion barrier layer, wherein the iridium layer has a (111) texture;

forming a PZT ferroelectric dielectric layer over the iridium bottom electrode layer, wherein the (111) texture of the iridium layer causes the PZT layer to form with a (111) texture; and forming a top electrode layer over the PZT ferroelectric dielectric layer.

* * * * *